United States Patent
Lin et al.

(10) Patent No.: US 11,657,864 B1
(45) Date of Patent: May 23, 2023

(54) IN-MEMORY COMPUTING APPARATUS AND COMPUTING METHOD HAVING A MEMORY ARRAY INCLUDES A SHIFTED WEIGHT STORAGE, SHIFT INFORMATION STORAGE AND SHIFT RESTORATION CIRCUIT TO RESTORE A WEIGH SHIFTED AMOUNT OF SHIFTED SUM-OF-PRODUCTS TO GENERATE MULTIPLE RESTORED SUM-OF-PRODUCTS

(71) Applicant: Winbond Electronics Corp., Taichung (TW)

(72) Inventors: Chi-Shun Lin, Fremont, CA (US); Ming-Huei Shieh, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 34 days.

(21) Appl. No.: 17/553,801

(22) Filed: Dec. 17, 2021

(51) Int. Cl.
  *G11C 11/22* (2006.01)
  *G11C 11/4097* (2006.01)
  *G11C 11/408* (2006.01)

(52) U.S. Cl.
  CPC ...... *G11C 11/2255* (2013.01); *G11C 11/4085* (2013.01); *G11C 11/4097* (2013.01)

(58) Field of Classification Search
  CPC ............ G11C 11/2255; G11C 11/4085; G11C 11/4097
  USPC ........................................................ 365/203
  See application file for complete search history.

(56) References Cited

U.S. PATENT DOCUMENTS

| | | | |
|---|---|---|---|
| 2016/0342891 A1* | 11/2016 | Ross | G06N 3/063 |
| 2018/0165577 A1* | 6/2018 | Young | G06N 3/0464 |
| 2020/0150927 A1 | 5/2020 | Terasaki | |
| 2020/0160159 A1 | 5/2020 | Azari et al. | |
| 2022/0238151 A1* | 7/2022 | Lin | G06F 7/501 |

FOREIGN PATENT DOCUMENTS

TW 202103161 1/2021

* cited by examiner

*Primary Examiner* — Connie C Yoha
(74) *Attorney, Agent, or Firm* — JCIPRNET (57) ABSTRACT

An in-memory computing apparatus and a computing method thereof are provided. A memory array includes a shifted weight storage area that stores shifted weight values, a shift information storage area that stores the number of shift units, and a shift unit amount storage area that stores a shift unit amount. A shift restoration circuit restores a weight shift amount of a shifted sum-of-products according to the number of shift units of the shifted weight values and a column shift unit amount, so as to generate multiple restored sum-of-products.

14 Claims, 5 Drawing Sheets

FIG. 5

IN-MEMORY COMPUTING APPARATUS AND COMPUTING METHOD HAVING A MEMORY ARRAY INCLUDES A SHIFTED WEIGHT STORAGE, SHIFT INFORMATION STORAGE AND SHIFT RESTORATION CIRCUIT TO RESTORE A WEIGH SHIFTED AMOUNT OF SHIFTED SUM-OF-PRODUCTS TO GENERATE MULTIPLE RESTORED SUM-OF-PRODUCTS

BACKGROUND

Technical Field

The disclosure relates to a computing apparatus, and more particularly, to an in-memory computing apparatus and a computing method thereof.

Description of Related Art

Artificial Intelligence (AI) refers to the technology that presents human intelligence through computer programs. At present, it has reached a superior level in image recognition, language analysis, and board games. Taking the AI network for image recognition as an example, the convolutional neural network (CNN) is currently a widely used solution for image recognition, including many multiply-accumulate (MAC) calculations, which involve multiplying the value (weight) stored in each memory element in the memory array by the input value and summing all the products, and involve a large amount of data movement, thus resulting in high power consumption.

SUMMARY

The disclosure relates to an in-memory computing apparatus and a computing method thereof, which may effectively reduce power consumption of the in-memory computing apparatus.

An in-memory computing apparatus of the disclosure includes a memory control circuit, a memory array, a sense circuit, and a shift restoration circuit. The memory array is coupled to the memory control circuit, and the memory control circuit controls data access of the memory array. The memory array includes a shifted weight storage area, a shift information storage area, and a shift unit amount storage area. The shifted weight storage area stores multiple shifted weight values, and provides multiple shifted sum-of-products according to multiple input signals provided by the memory control circuit through multiple first word lines. The shift information storage area stores a number of shift units of the shifted weight values, and provides the number of shift units of the shifted weight values according to multiple control signals provided by the memory control circuit through multiple second word lines. The shift unit amount storage area stores a shift unit amount, and provides a column shift unit amount according to the input signals. The column shift unit amount is equal to a sum-of-products of the input signals and the shift unit amount. The sense circuit is coupled to the memory array, and senses multiple current signals provided by the shifted weight storage area, the shift information storage area, and the shift unit amount storage area to obtain the multiple shifted sum-of-products, the number of shift units of the shifted weight values, and the column shift unit amount. The shift restoration circuit is coupled to the sense circuit, and restores weight shift amounts of the multiple shifted sum-of-products according to the number of shift units of the shifted weight values and the column shift unit amount, so as to generate multiple restored sum-of-products.

The disclosure further provides a computing method of an in-memory computing apparatus. The in-memory computing apparatus includes a memory array, and the memory array includes a shifted weight storage area, a shift information storage area, and a shift unit amount storage area. The shifted weight storage area stores multiple shifted weight values. The shift information storage area stores a number of shift units of the shifted weight values. The shift unit amount storage area stores a shift unit amount. The computing method of the in-memory computing apparatus includes the following steps. Multiple control signals are provided to the shift information storage area, so that the shift information storage area provides the number of shift units of the shifted weight values. Multiple input signals are provided to the shifted weight storage area and the shift unit amount storage area, so that the shifted weight storage area provides multiple shifted sum-of-products, and the shift unit amount storage area provides a column shift unit amount. The column shift unit amount is equal to a sum-of-products of the input signals and the shift unit amount. Weight shift amounts of the multiple shifted sum-of-products is restored according to the number of shift units of the shifted weight values and the column shift unit amount, so as to generate multiple restored sum-of-products.

Based on the above, the memory array in the embodiment of the disclosure includes the shifted weight storage area that stores the shifted weight values, the shift information storage area that stores the number of shift units, and the shift unit amount storage area that stores the shift unit amount. The shift restoration circuit may restore the weight shift amounts of the multiple shifted sum-of-products according to the number of shift units of the shifted weight values and the column shift unit amount, so as to generate the multiple restored sum-of-products. In this way, the shifted weight storage area stores the shifted weight values, and then uses the number of shift units of the shifted weight values and the column shift unit amount to restore the weight shift amounts of the multiple shifted sum-of-products, which may effectively reduce a current value on a bit line when the in-memory computing apparatus performs the sum-of-products operation, and may greatly reduce the power consumption of the in-memory computing apparatus.

DETAILED DESCRIPTION OF DISCLOSED EMBODIMENTS

In order for the disclosure to be more comprehensible, embodiments are described below as examples on which the disclosure may indeed be implemented. In addition, wherever possible, elements/components/steps with the same reference numerals in the drawings and embodiments represent the same or similar parts.

Figure 1:
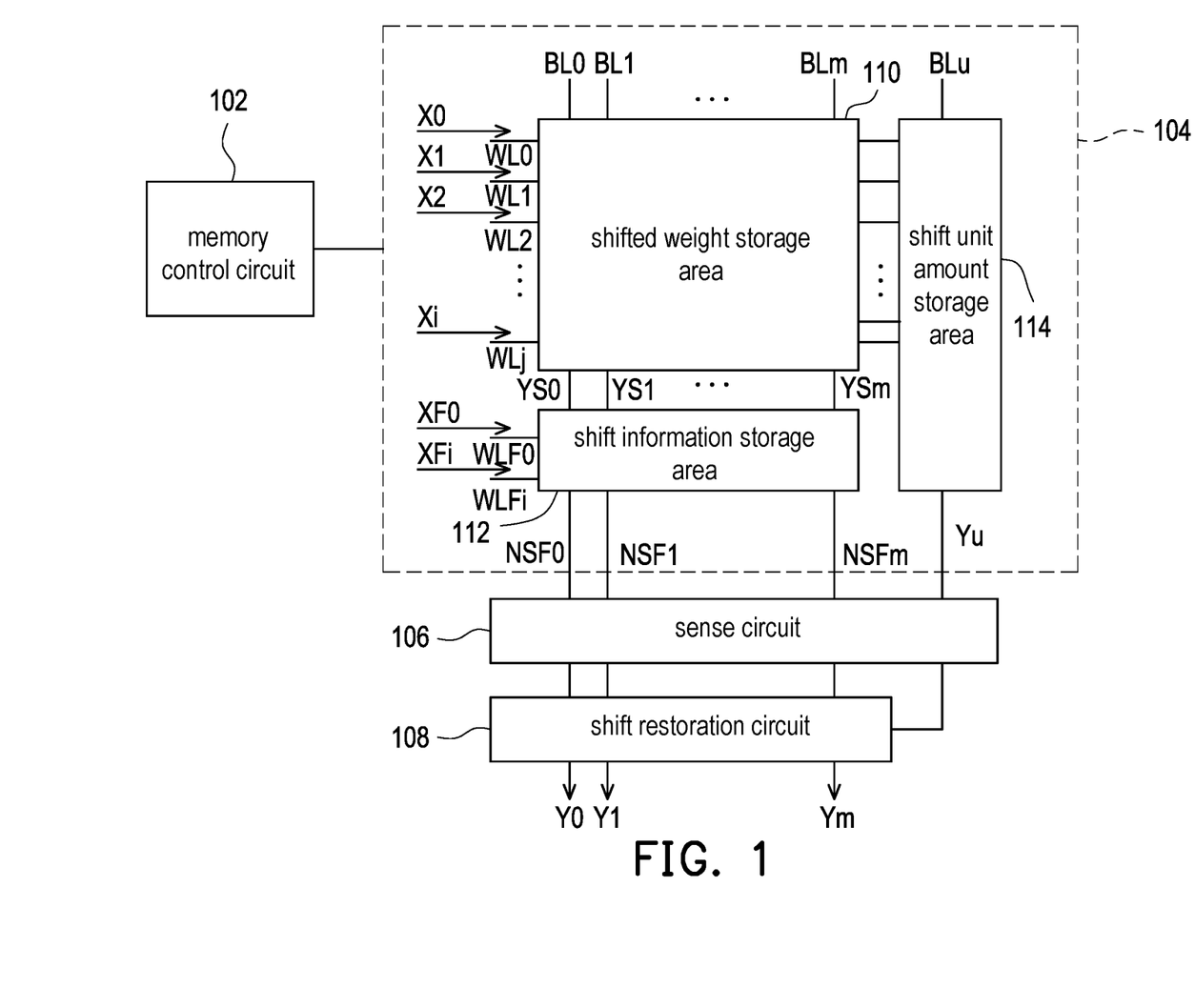
FIG. 1 is a schematic diagram of an in-memory computing apparatus according to an embodiment of the disclosure.

Hereinafter, referring to FIG. 1, FIG. 1 is a schematic diagram of an in-memory computing apparatus according to an embodiment of the disclosure. The in-memory computing apparatus may include a memory control circuit 102, a memory array 104, a sense circuit 106, and a shift restoration circuit 108. The memory array 104 is coupled to the memory control circuit 102 and the sense circuit 106, and the sense circuit 106 is further coupled to the shift restoration circuit 108. The memory array 104 may include a shifted weight storage area 110, a shift information storage area 112, and a shift unit amount storage area 114. The shifted weight storage area 110 stores multiple shifted weight values. The shift information storage area 112 stores a number of shift units NSF0 to NSFm corresponding to the shifted weight values. The shift unit amount storage area 114 stores a shift unit amount.

The memory control circuit 102 may control data access of the memory array 104. Furthermore, the memory control circuit 102 may provide multiple control signals X0 to XFi to the shift information storage area 112 through word lines WLF0 to WLFi, so that the shift information storage area 112 provides the number of shift units NSF0 to NSFm of the shifted weight values according to the control signals X0 to XFi, where i and m are positive integers. In addition, the memory control circuit 102 may provide multiple input signals X0 to Xj to the shifted weight storage area 110 and the shift unit amount storage area 114 through word lines WL0 to WLj (where j is a positive integer), so that the shifted weight storage area 110 provides multiple shifted sum-of-products YS0 to YSm according to the input signals X0 to Xj, and the shift unit storage area 114 provides a column shift unit amount Yu through a bit line BLu according to the input signals X0 to Xj. The multiple shifted sum-of-products YS0 to YSm are multiple sum-of-products of the input signals X0 to Xj and the shifted weight values. For example, the multiple shifted sum-of-products YS0 and YS1 may be represented by Formulas (1) and (2) in the following.

$$YS0 = \sum_{n=0}^{j} Xn \cdot (Wn0 - SF0) \tag{1}$$

$$YS1 = \sum_{n=0}^{j} Xn \cdot (Wn1 - SF1) \tag{2}$$

Xn is the input signal of the word line WLn, and SF0 and SF1 are respectively shift amounts of the shifted weight values stored in memory cells on bit lines BL0 and BL1. Wn0 is a weight value of the shifted weight value stored in the memory cell corresponding to the word line WLn on the bit line BL0 before being shifted by the shift amount SF0. Wn1 is a weight value of the shifted weight value stored in the memory cell corresponding to the word line WLn on the bit line BL1 before the shift by the shift amount SF1. In other words, Wn0 and Wn1 are the original weight values. "Wn0-SF0" is the shifted weight value stored in the memory cell corresponding to the word line WLn on the bit line BL0, and "Wn1-SF1" is the shifted weight value stored in the memory cell corresponding to the word line WLn on the bit line BL1. By analogy, YS2 to YSm may also be represented in a manner similar to Formula (1) or (2). Therefore, the same details will not be repeated in the following.

The sense circuit 106 may sense current signals provided by the shifted weight storage area 110, the shift unit amount storage area 114, and the shift information storage area 112 to obtain the multiple shifted sum-of-products YS0 to YSm, the number of shift units NSF0 to NSFm of the shifted weight values corresponding to bit lines BL0 to BLm, and the column shift unit amount Yu. The column shift unit amount Yu is equal to a sum-of-products of the input signals X0 to Xj and the shift unit amount stored in the shift unit amount storage area 114. The shift restoration circuit 108 may restore weight shift amounts of the multiple shifted sum-of-products YS0 to YSm according to the number of shift units NSF0 to NSFm and the column shift unit amount Yu, so as to generate multiple restored sum-of-products Y0 to Ym. For example, the restored sum-of-products Y0 may be represented by Formula (3) in the following.

$$\begin{aligned} Y0 &= \sum_{n=0}^{j} Xn \cdot (Wn0 - SF0) + Yu \cdot NSF0 \\ &= \sum_{n=0}^{j} Xn \cdot (Wn0 - SF0) + \sum_{n=0}^{j} Xn \cdot 1 \cdot NSF0 \\ &= \sum_{n=0}^{j} Xn \cdot (Wn0 - SF0) + \sum_{n=0}^{j} Xn \cdot SF0 \\ &= \sum_{n=0}^{j} Xn \cdot Wn0 \end{aligned} \tag{3}$$

As shown in Formula (3), in this embodiment, the column shift unit amount Yu is the sum-of-the products of the input signals X0 to Xj and the shift unit amount (in this embodiment, the shift unit amount stored in each of the memory cells in the shift unit amount storage area 114 is set to 1; however, the disclosure is not limited thereto, and the shift unit amount may be set according to requirements), and a product value (a shift adjustment amount) of the column shift unit amount Yu and the number of shift units NSF0 is designed to be equal to the shift amount SF0 of the shifted weight value corresponding to the bit line BL0. Therefore, finally the restored sum-of-products Y0 in which the weight shift amount has been restored may be obtained. Similarly, the restored sum-of-products Y1 may be represented by Formula (4) in the following.

$$\begin{aligned} Y1 &= \sum_{n=0}^{j} Xn \cdot (Wn1 - SF1) + Yu \cdot NSF1 \\ &= \sum_{n=0}^{j} Xn \cdot (Wn1 - SF1) + \sum_{n=0}^{j} Xn \cdot 1 \cdot NSF1 \\ &= \sum_{n=0}^{j} Xn \cdot (Wn1 - SF1) + \sum_{n=0}^{j} Xn \cdot SF1 \\ &= \sum_{n=0}^{j} Xn \cdot Wn1 \end{aligned} \tag{4}$$

By analogy, Y2 to Ym may also be represented in a manner similar to Formula (3) or (4). Therefore, the same details will not be repeated in the following.

In this way, the shifted weight storage area 110 stores the shifted weight values, and then uses the number of shift units NSF0 to NSFm of the shifted weight values and the column shift unit amount Yu to restore the weight shift amounts of the multiple shifted sum-of-products YS0 to YSm, which may effectively reduce a current value on the bit lines BL0 to BLm when the in-memory computing apparatus performs a sum-of-products operation, and may greatly reduce power consumption of the in-memory computing apparatus.

Figure 2:
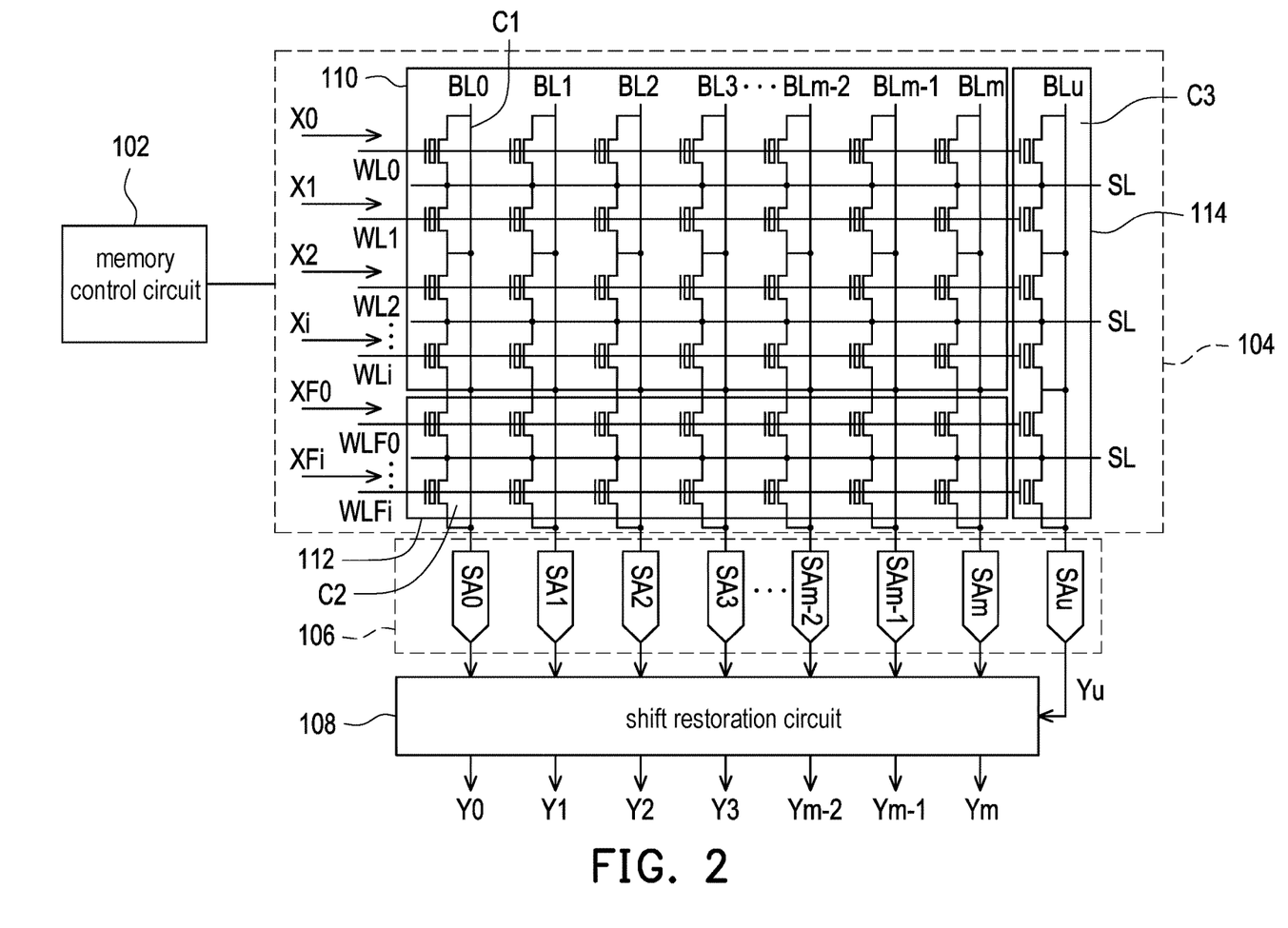
FIG. 2 is a schematic circuit diagram of an in-memory computing apparatus according to another embodiment of the disclosure.

FIG. 2 is a schematic circuit diagram of an in-memory computing apparatus according to another embodiment of the disclosure. Furthermore, the memory array 104 of the embodiment in FIG. 1 may be, for example, implemented with a NOR flash memory array as shown in FIG. 2. The shifted weight storage area 110 includes multiple memory cells C1. The shift information storage area 112 includes multiple memory cells C2. The shift unit amount storage area 114 includes multiple memory cells C3. In addition, the sense circuit 106 includes sensors SA0 to SAm and a sensor SAu.

One end of each of the memory cells C1, C2, and C3 is coupled to the corresponding sensor through the corresponding bit line, and the other end is coupled to a source line SL. A control end is coupled to the corresponding word line. For example, one end of the memory cells C1 and C2 on the bit line BL0 is coupled to the sensor SA0 through the bit line BL0, and the other end is coupled to the source line SL. The control ends of the memory cells C1 on the bit line BL0 are coupled to the word lines WL0 to WLj, and the control ends of the memory cells C2 on the bit line BL0 are coupled to the word lines WLF0 to WLFi. In addition, one end of the memory cell C3 on the bit line BLu is coupled to the bit line BLu, and the other end is coupled to the source line SL. The control ends are coupled to the word lines WL0 to WLj and WLF0 to WLFi.

The memory cells C1 may receive the input signals X0 to Xj from the word lines WL0 to WLj to provide the current signals representing the multiple shifted sum-of-products YS0 to YSm to the sensors SA0 to SAm through the bit lines BL0 to BLm according to the input signals X0 to Xj. The memory control circuit 102 may adjust the shifted weight values stored in the memory cells C1, for example, by adjusting a threshold voltage value or a resistance value of the memory cells C1, so that the shifted weight values have an expected offset. The shifted weight values stored in the memory cells C1 on the same bit line have the same shift amount. For example, the shifted weight values stored in the memory cells C1 on the bit line BL0 may have the same shift amount SF0. The memory cells C2 may receive the control signals X0 to XFi from the word lines WLF0 to WLFi to provide the current signals representing the number of shift units NSF0 to NSFm of the shifted weight values to the sensors SA0 to SAm through the bit lines BL0 to BLm according to the control signals X0 to XFi. In addition, the memory cells C3 may receive the input signals X0 to Xj from the word lines WL0 to WLj to provide the current signals representing the column shift unit amount Yu to the sensor SAu through the bit line BLu according to the input signals X0 to Xj.

Figure 3:
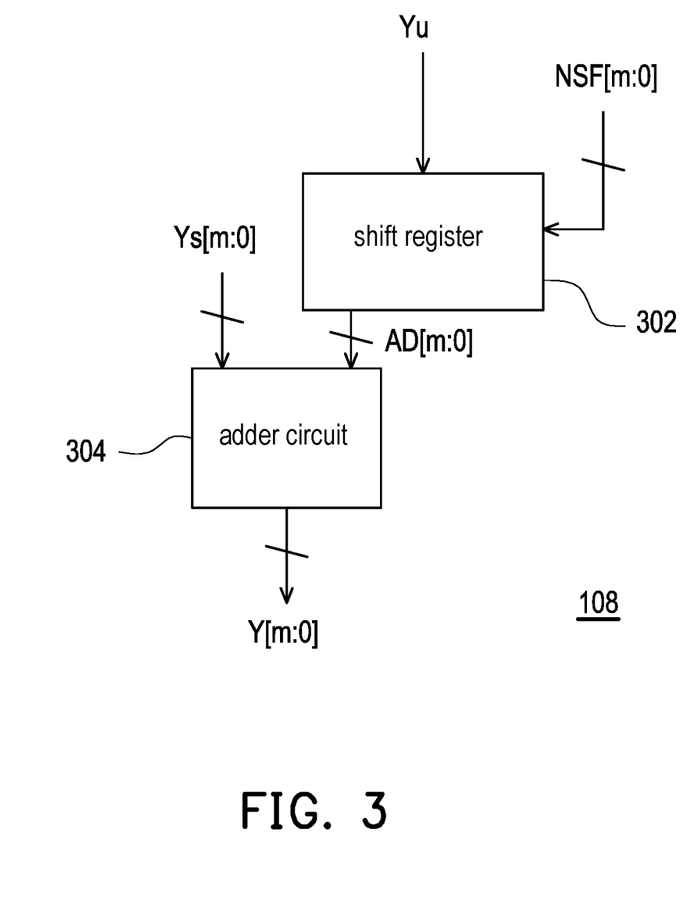
FIG. 3 is a schematic diagram of a shift restoration circuit according to an embodiment of the disclosure.

The sensors SA0 to SAm and the sensor SAu are coupled to the corresponding bit lines BL0 to BLm and BLu, and the shift restoration circuit 108, and provide sensing results of the multiple shifted sum-of-products YS0 to YSm, the number of shift units NSF0 to NSFm, and the column shift unit amount Yu to the shift restoration circuit 108, so as to restore the weight shift amounts of the multiple shifted sum-of-products YS0 to YSm, and generate the multiple restored sum-of-products Y0 to Ym. An implementation of the shift restoration circuit 108 may, as shown in FIG. 3,
includes a shift register 302 and an adder circuit 304. The shift register 302 is coupled to the sensors SA0 to SAm and the sensor SAu, and the adder circuit 304 is coupled to the shift register 302. The shift register 302 may receive the number of shift units NSF0 to NSFm and the column shift unit amount Yu provided by the sensors SA0 to SAm and the sensor SAu, and generate shift adjustment amounts AD0 to ADm used to restore the multiple shifted sum-of-products YS0 to YSm according to the number of shift units NSF0 to NSFm and the column shift unit amount Yu. The adder circuit 304 may add the multiple shifted sum-of-products YS0 to YSm provided by the sensors SA0 to SAm and the corresponding shift adjustment amounts AD0 to ADm, so as to generate the multiple restored sum-of-products Y0 to Ym.

Figure 4:
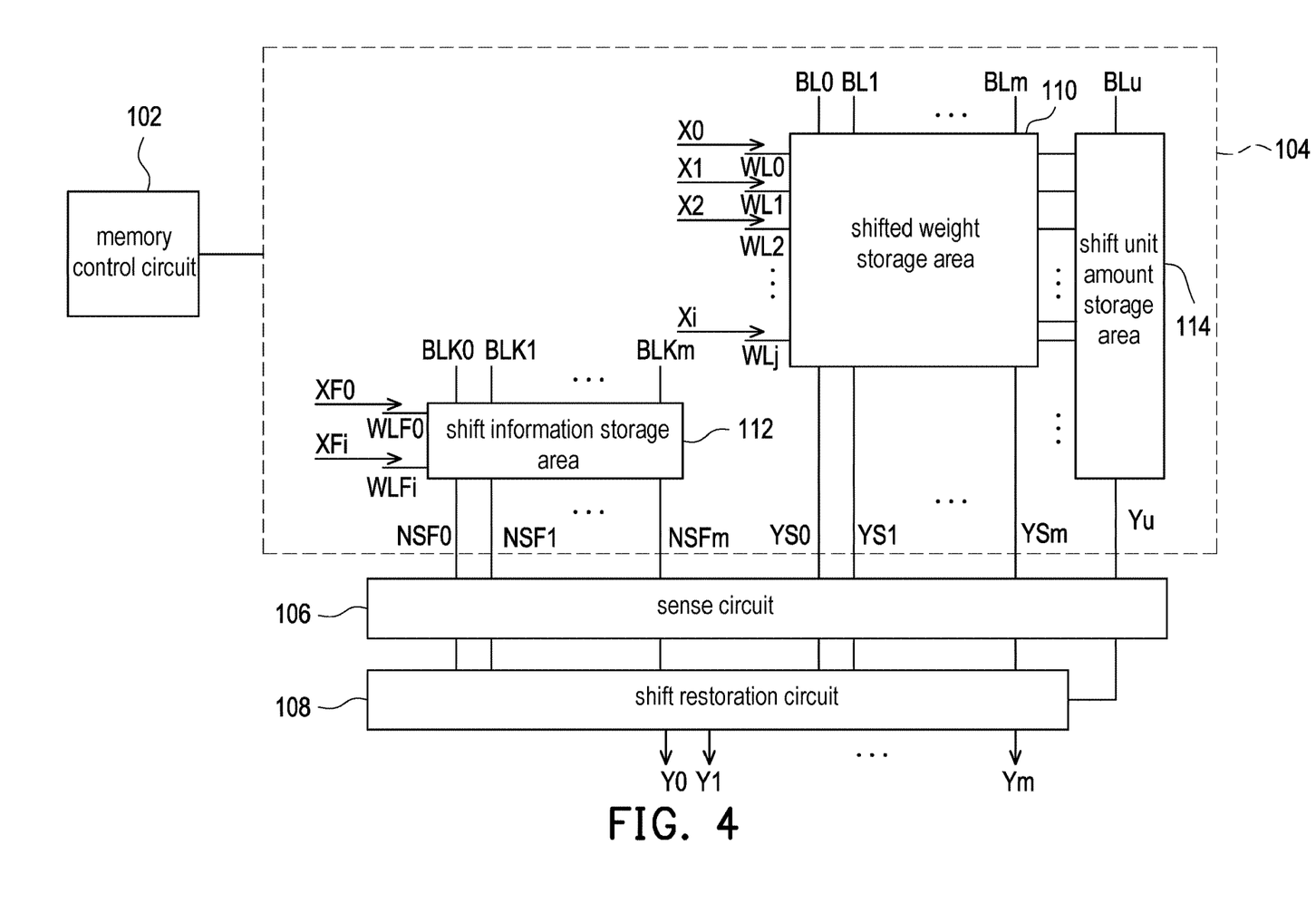
FIG. 4 is a schematic diagram of an in-memory computing apparatus according to another embodiment of the disclosure.

Note that although the shifted weight storage area 110 and the shift information storage area 112 in the above embodiment share the bit lines BL0 to BLm, in other embodiments, the shifted weight storage area 110 and the shift information storage area 112 may also use different bit lines. For example, in the embodiment of FIG. 4, the shifted weight storage area 110 is coupled to the bit lines BL0 to BLm, and the shift information storage area 112 is coupled to bit lines BLK0 to BLKm. The shifted weight storage area 110 and the shift information storage area 112 in this embodiment do not share the bit lines. Therefore, it is not necessary to drive the shift information storage area 112 and the shifted weight storage area 110 sequentially to obtain the number of shift units NSF0 to NSFm and the multiple shifted sum-of-products YS0 to YSm. The shift information storage area 112 and the shifted weight storage area 110 may be driven at the same time, so that the shift information storage area 112 and the shifted weight storage area 110 provide the number of shift units NSF0 to NSFm and the multiple shifted sum-of-products YS0 to YSm at the same time. As a result, the computing efficiency of the in-memory computing apparatus may be effectively improved.

Figure 5:
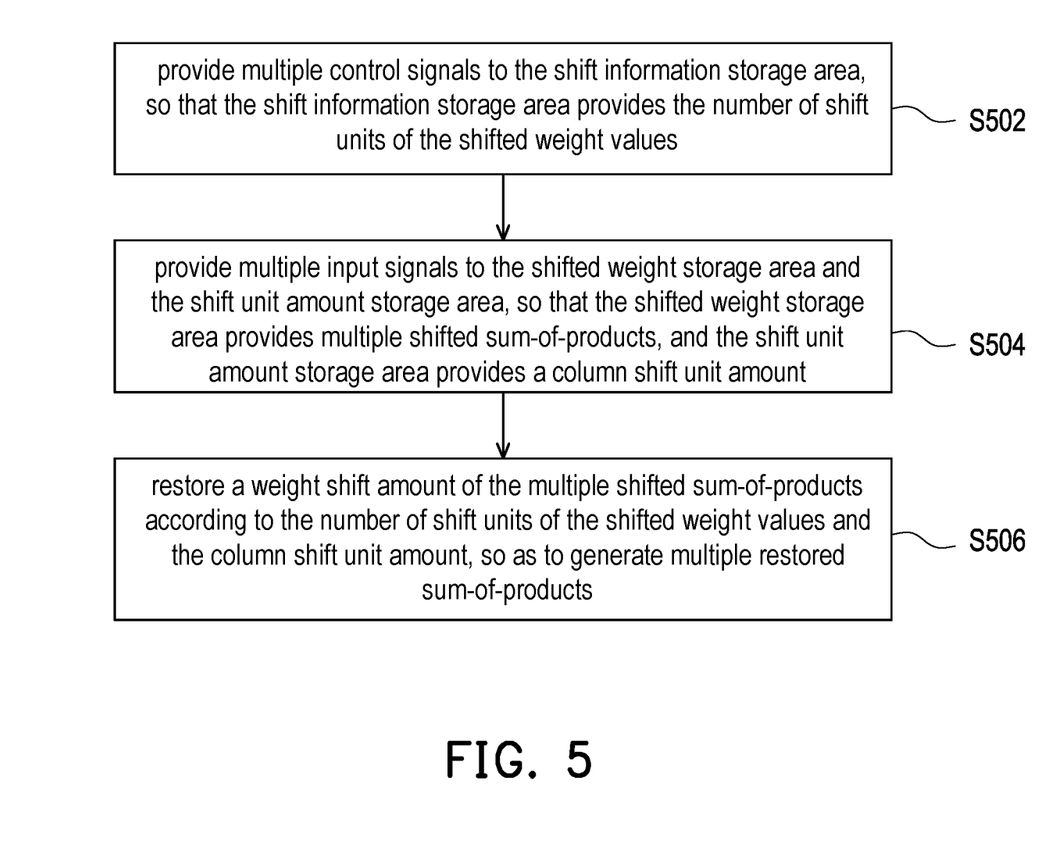
FIG. 5 is a flowchart of a computing method of an in-memory computing apparatus according to an embodiment of the disclosure.

FIG. 5 is a flowchart of a computing method of an in-memory computing apparatus according to an embodiment of the disclosure. The in-memory computing apparatus includes a memory array. The memory array includes a shifted weight storage area, a shift information storage area, and a shift unit amount storage area. The shifted weight storage area stores multiple shifted weight values. The shift information storage area stores a number of shift units. The shift unit amount storage area stores a shift unit amount. The shifted weight storage area may include multiple first memory cells. The shift information storage area may include multiple second memory cells. The shift unit amount storage area may include multiple third memory cells. The first memory cells and the second memory cells share multiple bit lines, and the first memory cells and the third memory cells use different bit lines.

In light of the above embodiment, the computing method of the in-memory computing apparatus may include at least the following steps. First, multiple control signals are provided to the shift information storage area, so that the shift information storage area provides the number of shift units of the shifted weight values (step S502). The shifted weight values stored in the first memory cells may be adjusted by adjusting a threshold voltage value or a resistance value of the first memory cells, and the shifted weight values stored in the first memory cells on the same bit line have the same shift amount. Then, multiple input signals are provided to the shifted weight storage area and the shift unit amount storage area, so that the shifted weight storage area provides multiple shifted sum-of-products, and the shift unit amount storage area provides a column shift unit amount (step S504). The column shift unit amount is equal to a sum-of-products of the input signals and the shift unit amount. Finally, weight shift amounts of the multiple shifted sum-of-products are restored according to the number of shift units of the shifted weight values and the column shift unit amount, so as to generate multiple restored sum-of-products (step S506). Furthermore, multiple shift adjustment amounts may be generated according to the number of shift units of the shifted weight values and the column shift unit amount, and then the multiple shifted sum-of-products and the corresponding shift adjustment amounts are respectively added, so as to generate the multiple restored sum-of-products. In addition, note that in some embodiments, the bit lines coupled to the shifted weight storage area may be different from the bit lines coupled to the shift information storage area, which may effectively improve the computing efficiency of the in-memory computing apparatus.

Based on the above, the memory array in the embodiment of the disclosure includes the shifted weight storage area that stores the shifted weight values, the shift information storage area that stores the number of shift units, and the shift unit amount storage area that stores the column shift unit amount. The shift restoration circuit may restore the weight shift amounts of the multiple shifted sum-of-products according to the number of shift units of the shifted weight values and the column shift unit amount, so as to generate the multiple restored sum-of-products. In this way, the shifted weight storage area stores the shifted weight values, and then uses the number of shift units of the shifted weight values and the column shift unit amount to restore the weight shift amounts of the shifted sum-of-products, which may effectively reduce the current value on the bit lines when the in-memory computing apparatus performs the sum-of-products operation, and may greatly reduce the power consumption of the in-memory computing apparatus. In some embodiments, the bit lines coupled to the shifted weight storage area may be different from the bit lines coupled to the shift information storage area, which may effectively improve the computing efficiency of the in-memory computing apparatus.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An in-memory computing apparatus, comprising:
   a memory control circuit;
   a memory array coupled to the memory control circuit, wherein the memory control circuit controls data access of the memory array, and the memory array comprises:
      a shifted weight storage area storing a plurality of shifted weight values, and providing a plurality of shifted sum-of-products according to a plurality of input signals provided by the memory control circuit through a plurality of first word lines;
      a shift information storage area storing a number of shift units of the plurality of shifted weight values, and providing the number of shift units of the plurality of shifted weight values according to a plurality of control signals provided by the memory control circuit through a plurality of second word lines; and
      a shift unit amount storage area storing a shift unit amount, and providing a column shift unit amount according to the plurality of input signals, wherein the column shift unit amount is equal to a sum-of-products of the plurality of input signals and the shift unit amount;
   a sense circuit coupled to the memory array, sensing a plurality of current signals provided by the shifted weight storage area, the shift information storage area, and the shift unit amount storage area to obtain the plurality of shifted sum-of-products, the number of shift units of the plurality of shifted weight values, and the column shift unit amount; and
   a shift restoration circuit coupled to the sense circuit, and restoring weight shift amounts of the plurality of shifted sum-of-products according to the number of shift units of the plurality of shifted weight values and the column shift unit amount to generate a plurality of restored sum-of-products.

2. The in-memory computing apparatus according to claim 1, wherein the sense circuit comprises a plurality of first sensors and a second sensor, the shifted weight storage area comprises a plurality of first memory cells, the shift information storage area comprises a plurality of second memory cells, the shift unit amount storage area comprises a plurality of third memory cells, the plurality of first memory cells and the plurality of second memory cells are coupled to the plurality of first sensors through a plurality of first bit lines, the plurality of third memory cells are coupled to the second sensor through a second bit line, the plurality of first memory cells and the plurality of third memory cells share the plurality of first word lines, and the plurality of second memory cells are coupled to the plurality of second word lines.

3. The in-memory computing apparatus according to claim 2, wherein the plurality of first memory cells receive the plurality of input signals from the plurality of first word lines to provide a plurality of current signals representing the plurality of shifted sum-of-products to the plurality of first sensors through the plurality of first bit lines according to the plurality of input signals, the plurality of third memory cells receive the plurality of input signals from the plurality of first word lines to provide a current signal representing the column shift unit amount to the second sensor through the second bit line according to the plurality of input signals, and the plurality of second memory cells receive the plurality of control signals from the plurality of second word lines to provide a plurality of current signals representing the number of shift units of the plurality of shifted weight values to the plurality of first sensors through the plurality of first bit lines according to the plurality of control signals.

4. The in-memory computing apparatus according to claim 2, wherein the shift restoration circuit comprises:
   a shift register coupled to the plurality of first sensors and the second sensor, and generating a plurality of shift adjustment amounts according to the number of shift units of the plurality of shifted weight values and the column shift unit amount; and
   an adder circuit coupled to the shift register and the plurality of first sensors, and respectively adding the plurality of shifted sum-of-products provided by the plurality of first sensors and the corresponding shift adjustment amount to generate the plurality of restored sum-of-products.

5. The in-memory computing apparatus according to claim 2, wherein in the shifted weight storage area, the plurality of shifted weight values stored in the plurality of first memory cells on the same bit line have a same shift amount.

6. The in-memory computing apparatus according to claim 2, wherein the memory control circuit adjusts a threshold voltage value or a resistance value of the plurality of first memory cells to adjust the plurality of shifted weight values.

7. The in-memory computing apparatus according to claim 1, wherein a bit line coupled to the shifted weight storage area is different from a bit line coupled to the shift information storage area.

8. A computing method of an in-memory computing apparatus, wherein the in-memory computing apparatus comprises a memory array, the memory array comprises a shifted weight storage area, a shift information storage area, and a shift unit amount storage area, the shifted weight storage area stores a plurality of shifted weight values, the shift information storage area stores a number of shift units of the plurality of shifted weight values, the shift unit amount storage area stores a shift unit amount, and the computing method of the in-memory computing apparatus comprises:

provinding a plurality of control signals to the shift information storage area, so that the shift information storage area provides the number of shift units of the plurality of shifted weight values;

providing a plurality of input signals to the shifted weight storage area and the shift unit amount storage area, so that the shifted weight storage area provides a plurality of shifted sum-of-products, and the shift unit amount storage area provides a column shift unit amount, wherein the column shift unit amount is equal to a sum-of-products of the plurality of input signals and the shift unit amount; and restoring weight shift amounts of the plurality of shifted sum-of-products according to the number of shift units of the plurality of shifted weight values and the column shift unit amount to generate a plurality of restored sum-of-products.

9. The computing method of the in-memory computing apparatus according to claim 8, wherein the shifted weight storage area comprises a plurality of first memory cells, the shift information storage area comprises a plurality of second memory cells, and the shift unit amount storage area comprises a plurality of third memory cells.

10. The computing method of the in-memory computing apparatus according to claim 9, wherein the plurality of first memory cells and the plurality of second memory cells share a plurality of bit lines, and the plurality of first memory cells and the plurality of third memory cells use different bit lines.

11. The computing method of the in-memory computing apparatus according to claim 9, comprising:

generating a plurality of shift adjustment amounts according to the number of shift units of the plurality of shifted weight values and the column shift unit amount; and respectively adding the plurality of shifted sum-of-products and the corresponding shift adjustment amount to generate the plurality of restored sum-of-products.

12. The computing method of the in-memory computing according to claim 9, wherein in the shifted weight storage area, the plurality of shifted weight values stored in the plurality of first memory cells on the same bit line have a same shift amount.

13. The computing method of the in-memory computing apparatus according to claim 9, comprising:

adjusting a threshold voltage value or a resistance value of the plurality of first memory cells to adjust the plurality of shifted weight values.

14. The computing method of the in-memory computing apparatus according to claim 8, wherein a bit line coupled to the shifted weight storage area is different from a bit line coupled to the shift information storage area.

* * * * *